United States Patent [19]

Nakagawa et al.

[11] Patent Number: 5,068,704
[45] Date of Patent: Nov. 26, 1991

[54] METHOD OF MANUFACTURING SEMICONDUCTOR DEVICE

[75] Inventors: Akio Nakagawa, Hiratsuka; Kaoru Imamura, Kawasaki; Ryo Sato; Tadahide Hoshi, both of Yokohama, all of Japan

[73] Assignee: Kabushiki Kaisha Toshiba, Kawasaki, Japan

[21] Appl. No.: 520,446

[22] Filed: May 8, 1990

Related U.S. Application Data

[62] Division of Ser. No. 161,097, Feb. 26, 1988, Pat. No. 4,935,386.

[30] Foreign Application Priority Data

Feb. 26, 1987 [JP] Japan .................................. 62-43562
Dec. 28, 1987 [JP] Japan ................................. 62-330063

[51] Int. Cl.$^5$ .............................................. H01L 29/74
[52] U.S. Cl. ....................................... 357/38; 357/23.4; 357/39; 357/42
[58] Field of Search ............. 357/23.4, 38, 42, 86, 357/89, 39, 91

[56] References Cited

U.S. PATENT DOCUMENTS

| | | | |
|---|---|---|---|
| 3,855,611 | 12/1974 | Neilson et al. | 357/38 |
| 4,278,476 | 7/1981 | Bartko et al. | 357/38 |
| 4,364,073 | 12/1982 | Becke et al. | 357/23.4 |
| 4,587,713 | 5/1986 | Goodman et al. | 357/91 |
| 4,680,604 | 7/1987 | Nakagawa et al. | 357/23.4 |
| 4,766,482 | 8/1988 | Smeltzer et al. | 357/91 |
| 4,782,379 | 11/1988 | Baliga | 357/23.4 |
| 4,914,496 | 4/1990 | Nakagawa et al. | 357/23.4 |

FOREIGN PATENT DOCUMENTS 62-076557  4/1987  Japan .................................. 357/23.4

*Primary Examiner*—Andrew J. James
*Assistant Examiner*—Hung Xuan Dang
*Attorney, Agent, or Firm*—Oblon, Spivak, McClelland, Maier & Neustadt

[57] ABSTRACT

A method of manufacturing a semiconductor device comprising the steps of bringing a mirror-polished surface of a first semiconductor substrate of a first conductivity type into contact with a mirror-polished surface of a second semiconductor substrate of a second conductivity type having an impurity concentration which is lower than that of said first conductivity type, in a clean atmosphere, and thermally heating said first and second semiconductor substrates so that they unite. Impurity is diffused from said first semiconductor substrate into said second semiconductor substrate, thereby forming a diffusion layer of a first conductivity type in said second semiconductor substrate. A total amount of impurity of said diffusion layer is $1 \times 10^{13}/\text{cm}^2$ to $2 \times 10^{15}/\text{cm}^2$, to form a pn junction in said second semiconductor substrate.

7 Claims, 5 Drawing Sheets

METHOD OF MANUFACTURING SEMICONDUCTOR DEVICE

This is a division of application Ser. No. 07/161,097, on Feb. 26, 1988, U.S. Pat. No. 4,935,386.

BACKGROUND OF THE INVENTION

1. Field of the Invention

This invention relates to a method of manufacturing a semiconductor device by using a technique to directly bond two semiconductor substrates.

2. Description of the related art including information disclosed under §§1.97-1.99

In power semiconductor devices, with increase of the rated voltage, the specific resistance of the epitaxial wafer with an epitaxial layer formed by vapor growth process must be large. When the semiconductor substrate of high impurity concentration is used, it is very difficult to form a high resistance epitaxial layer in the substrate, because impurity from the substrate inevitably enters the epitaxial layer. For example, formation of an epitaxial wafer with $n+-n-$ junction whose $n-$ layer resistance is 100 $\Omega$.cm or more, for example is very difficult.

In the conductivity-modulation-type MOS FET, for example, there are some instances where $n+$-layer and $n-$ layer are epitaxially grown on a $p+$-substrate in a successive manner. In forming such an epitaxial wafer, the impurity compensation occurs at the interface between the $p+$-$n+$ junction, so that desired junction characteristic can hardly be obtained. The same problem arises also in the case that the high impurity concentration layer is formed in a high impurity concentration layer whose conductivity type is opposite to that of the former, by a diffusion method.

As described above, when the conventional growth method or the diffusion method are used, the p-n junction characteristic obtained is always unsatisfactory.

SUMMARY OF THE INVENTION

An object of this invention is to provide a method of manufacturing a semiconductor device, which uses a semiconductor substrate of a high impurity concentration, and realizes the element characteristic improvement.

In the method of manufacturing a semiconductor device according to this invention, mirror polishing is first applied to each one surface of a first semiconductor substrate of a first conductivity type and a second semiconductor substrate of a second conductivity type whose impurity concentration is lower than that of the former. Those mirror polished surfaces of the first and second semiconductor substrates are made in contact with each other in a clean atmosphere, with no foreign substances existing between these surfaces, and are subjected to heat treatment, to bond them. This heat treatment or another heat treatment causes impurity to diffuse to the second semiconductor substrate from the first semiconductor substrate, so that a first conductivity type diffusion layer is formed in the second semiconductor substrate.

A total amount of impurity per unit area in the first semiconductor type diffusion layer is preferably $1 \times 10^{13}/cm^2$ to $2 \times 10^{15}/cm^2$, more preferably $1 \times 10^{14}/cm^2$ to $1 \times 10^{15}/cm^2$.

The impurity diffusion from the first semiconductor substrate to the second semiconductor substrate may be performed by another heat treatment, which is different from the above one.

Thickness of diffusion layer is 6 $\mu$m or less, more preferably 3 to 6 $\mu$m.

A second conductivity type diffusion layer may be previously formed on the surface of the second semiconductor substrate, which is to be bonded to the first semiconductor substrate. In this case, it is preferable that the formation of the first conductivity type diffusion layer by the impurity diffusion from the first semiconductor substrate to the second semiconductor substrate is performed, while a part of the second conductivity type diffusion layer is left. The total amount of impurity per unit area in the left portion of the second conductivity type diffusion layer is $5 \times 10^{13}/cm^2$ to $1 \times 10^{15}/cm^2$, more preferably $5 \times 10^{13}$ to $5 \times 10^{14}/cm^2$.

Where the second conductivity type diffusion layer formed in the second substrate is used as an emitter, the emitter injection efficiency is appropriately low. The reason for this is that the substrate bonding interface with a small carrier lifetime exists close to the emitter junction, and a total amount of impurity between the emitter junction and the bonding interface is small. Accordingly, when the conductivity modulation type MOSFET or GTO is formed by using the element wafer as formed according to this invention, the carrier lifetime of the second substrate is long and a high speed switching operation is possible. Further, since the carrier lifetime of the second substrate is long, the forward voltage drop of the element can be kept small.

If the impurity total amount in the first conductivity type diffusion layer, which is formed in the second substrate by the diffusion process, is smaller than $1 \times 10^{13}/cm^2$, this diffusion layer does not function as the emitter layer. This diffusion layer must be substantially equal in thickness to or thinner than the carrier diffusion length, and is preferably 6 $\mu$m or less. To shorten the carrier lifetime at the bonding interface of the first and second substrates, it is desirable to make the lattice at the interface irregular. This can be obtained by using the substrates with different index of plane or utilizing the nature of the time killers that when thermally diffused, those tend to concentrate at the interface.

DESCRIPTION OF THE PREFERRED EMBODIMENTS

Two specific examples of methods of manufacturing a semiconductor device according to this invention, will now be described referring to the accompanying drawings.

EXAMPLE 1

Figure 1A:
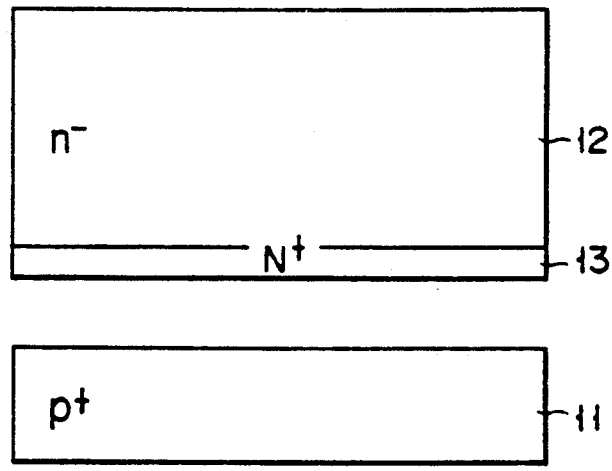
FIGS. 1A to 1C are sectional views showing a sequence of steps to manufacture conductivity modulation type MOSFETs to which this invention is applied.
Figure 1B:
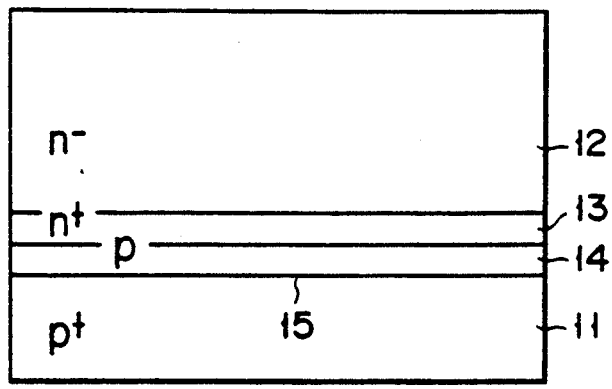
Figure 1C:
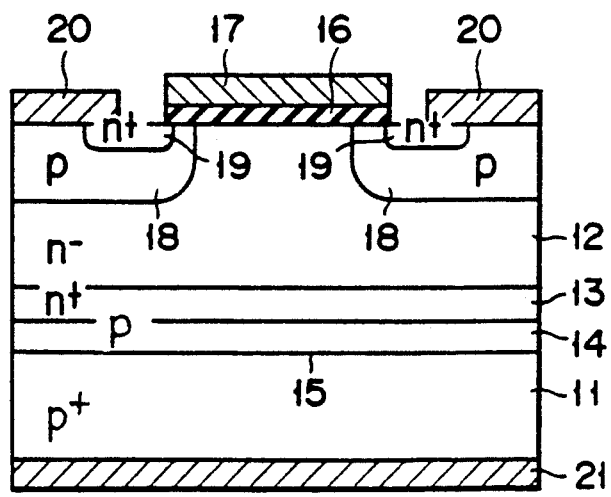

FIGS. 1A to 1C are sectional views showing a sequence of steps used in manufacturing conductivity modulation type MOSFETs to which this invention is applied. As shown in FIG. 1A, p+-type Si substrate 11 (first semiconductor substrate) and n—-type Si substrate 12 (second semiconductor substrate), which are both mirror polished, are prepared. In this example, the impurity concentration of p+-type Si substrate 11 is $2 \times 10^{18}/cm^3$ to $5 \times 10^{19}/cm^3$. Ions of phosphorus P are implanted into the surface region of the mirror-polished n—-type Si substrate 12, at a $2 \times 10^{15}/cm^2$ dosage, to form shallow n+ diffusion layer 13. The plane orientations of substrates 11 and 12 are different, being 111 and 100, respectively. The polished surfaces of substrates 11 and 12 are bonded in a clean atmosphere, and then thermally heated at 1,100° C. in an oxygen-containing atmosphere, thereby uniting them as shown in FIG. 1B.

An example of a manner in which these substrates can be directly bonded will be described. The surfaces of the two substrates, which are to be bonded, are mirror polished to a roughness of at most 500 Angstroms. If necessary, the substrate surfaces are subjected to preliminary treatments for the degreasing or stain film removal. These preliminary treatments contain the steps of treatment by $H_2O_2 + H_2SO_4 \rightarrow$ aqua regia boiling $\rightarrow$ treatment by HF, for example. After this, the substrates are washed with clean water for several minutes, and are dewatered by a spinner, drying at room temperature. This dewatering process removes excess moisture adsorbed in the polished surfaces. In this case, it is important not to use the drying process at 100° C. or more in which most of the water adsorbed in the polished surfaces evaporates. Subsequently, the polished surfaces of these substrates are made to intimately contact one another, in a clean atmosphere at a cleanness of class 1 or less, wherein foreign substances are almost completely removed. Then, these are thermally heated at 200° C. or more. In the case of the Si substrate, the preferable temperature ranges from 1000° C. to 1200° C.

In this way, two substrates are bonded to obtain a bonded wafer shown in FIG. 1B. By the above heat treatment or another heat treatment (at 1,100°), p-type diffusion layer 14 is formed in the surface region of substrate 12. The formed p-type diffusion layer 14 is such that the thickness measured from bonding interface 15 is about 6 μm or less, in this instance, 5 μm, and a total amount of impurity per unit area is $1 \times 10^{13}/cm^2$ to $2 \times 10^{15}/cm^2$, preferably $1 \times 10^{14}/cm^2$ to $1 \times 10^{15}/cm^2$. In this case, it is $5 \times 10^{14}/cm^2$.

As shown in FIG. 1C, after the surface of n—-type Si substrate 12 is polished to have a predetermined thickness, if necessary, gate insulating film 16 is formed thereover, and gate electrode 17 is further formed on insulating film 16. p-type base region 18 and n+-type source region 19 are formed in substrate 12 by diffusion of an impurity, e.g., boron and arsenic. Finally, source electrode 20 and drain electrode 21 are formed as shown in FIG. 1C, to complete the structure of conductivity modulation type MOSFET.

The semiconductor device manufactured by the above-mentioned embodiment is free from the impurity compensation occurring when n+ and n—-type layers are sequentially grown by an epitaxial method, and thus has an excellent characteristic. p-type diffusion layer 14 as formed by impurity diffusion from p+-type substrate 11 to substrate 12 serves as an emitter for injecting holes, and a conductivity modulation occurs if the heat treatment at the substrate bonding or after the substrate bonding is insufficiently performed, the impurity total amount of p-type diffusion layer 14 is less than $1 \times 10^{13}/cm^2$, and no conductivity modulation occurs. There is provided an upper limit ($2 \times 10^{15}/cm^2$) in the impurity total amount of p type diffusion layer 14. The reason for this is that an excessive impurity total amount causes the emitter injection efficiency to be too large, and carriers are excessively stored, so that the element switching is slow. When the emitter injection efficiency is too large, one of the possible ways to solve this problem is to reduce the carrier lifetime by irradiating the diffusion layer 14 with electron rays. This approach, however, involves the following problems. The turn-off time is reduced at normal temperature; however, the turn-off time at 125° C. is three times that at temperature 25° C. n+-type layer 13, which has been formed in n-type Si substrate 12, is left at such a predetermined thickness as to provide $5 \times 10^{13}/cm^2$ to $1 \times 10^{15}/cm^2$ of a total amount of impurity per unit.

In this way, the impurity total amount of the p-type diffusion layer as an emitter, which is formed by the diffusion through the bonding interface is reduced, so that a satisfactory cooperating relationship between the element switching speed and the forward voltage drop can be kept. Specifically, when a semiconductor element is considered fixing the switching speed at a given value, if the total impurity amount of p-type diffusion layer 14 is large, the carrier life time in n— substrate 12 must be reduced. It is noted here that in this embodiment, n—-type substrate 12 may be formed so as to have a sufficiently high resistance, ensuring a long carrier lifetime, and thus securing a low forward voltage drop.

EXAMPLE 2

Figure 2A:
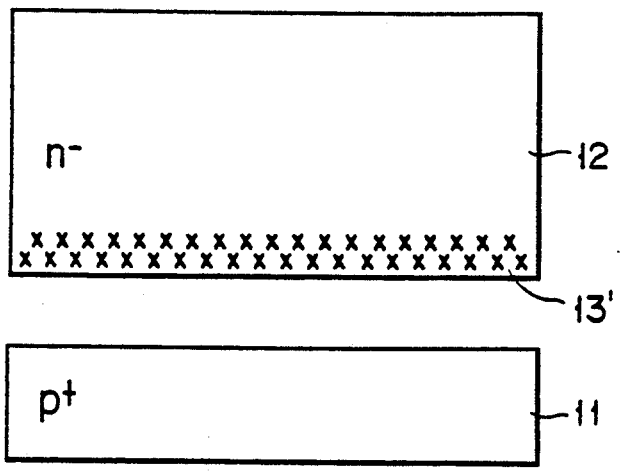
FIGS. 2A to 2C are sectional views showing a sequence of steps to manufacture other conductivity modulation type MOSFETs to which this invention is applied.
Figure 2B:
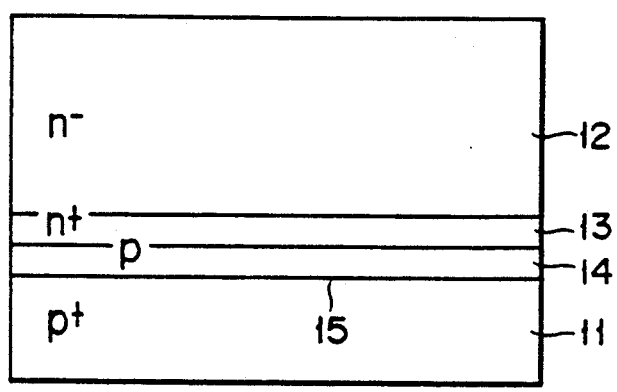
Figure 2C:
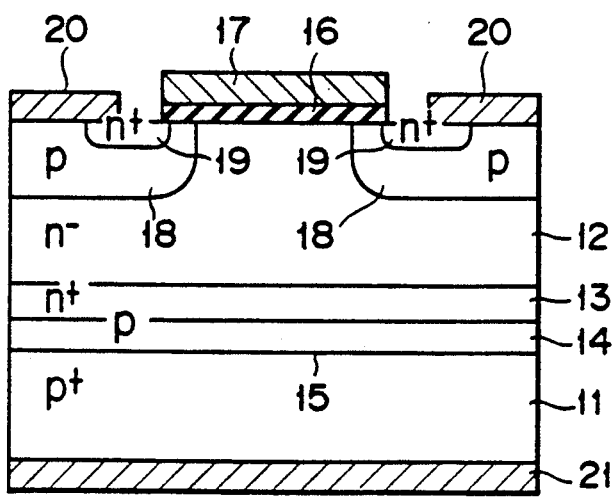

Turning now to FIGS. 2A to 2C, there are shown in sectional form a sequence of process steps of the method of manufacturing another conductivity modulation type MOSFET according to this invention. In this embodiment, phosphorus ion implanted layer 13' is formed in the surface region of substrate 12. Following this, substrates 11 and 12 are directly bonded without performing the heat treatment step for activating impurity. Ionlayer 13' is formed under the condition of, for example, 40 keV of accelerating voltage and $2 \times 10^{15}/cm^2$ of dosage. The subsequent steps to manufacture are the same as those of Example 1. After the substrate bonding, the structure is subjected to heat treatment at about 1100° C. By the heat treatment, the implanted impurity in the layer 13' is activated, and n+-type layer 13 is formed as in the case of the above-mentioned embodiment. Further, p-type layer 14 is formed in the substrate 12, with a predetermined depth as measured from the surface of bonding interface 15.

In the manufacturing method, resistivity of p+-type Si substrate 11 is set preferably in the range from 0.01 to 0.05 Ω·cm, and the thickness of p-type layer 14 diffusion formed in substrate 12 is preferably in the range from 3 to 7 μm. This is backed up by the data to be given below.

Figure 3:
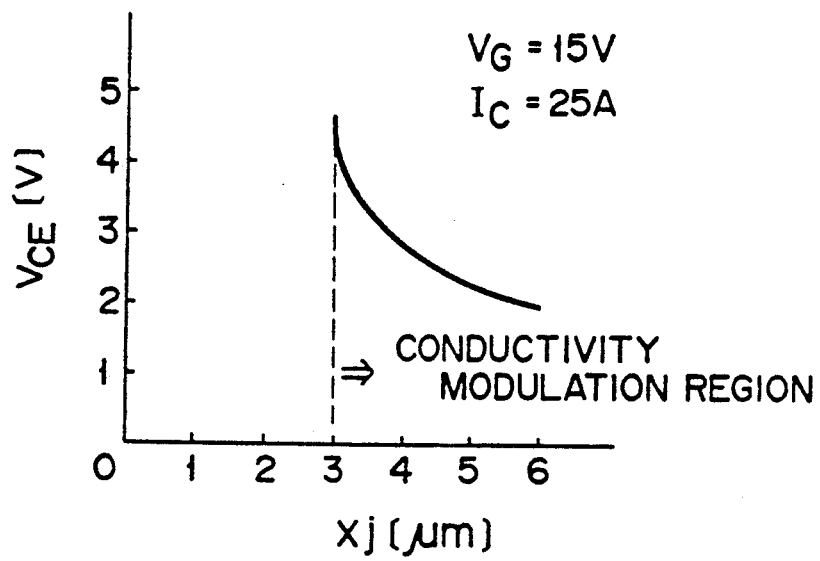
FIG. 3 shows a graph showing a relationship of the thickness of a p-type layer of the semiconductor element shown in FIG. 2C and the collector-emitter voltage.

FIG. 3 shows a relationship between the thickness xj of p-type layer 14 and the collector-emitter voltage $V_{CE}$ of the element. The resistivity of p-type Si substrate 11 used is 0.015 Ω·cm, and that of n-type Si substrate 12 62.5 Ω·cm, respectively. The measured conditions are gate voltage VG=15V and collector current I=25A. When xj < 3 μm, no conductivity modulation is observed. To obtain $V_{CE}$ < 4V, where the conductivity modulation is observed, the thickness must be xj > 3 μm.

Figure 4:
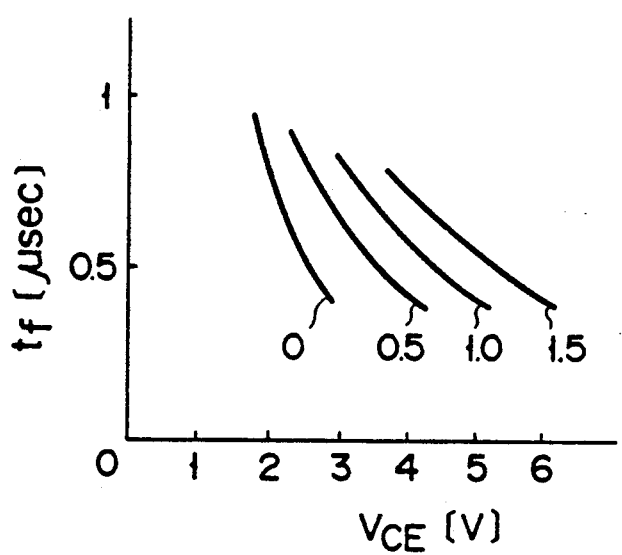
FIG. 4 is a graph showing a relationship of the collector-emitter voltage of the semiconductor element shown in FIG. 2C and a switching speed.
Figure 5:
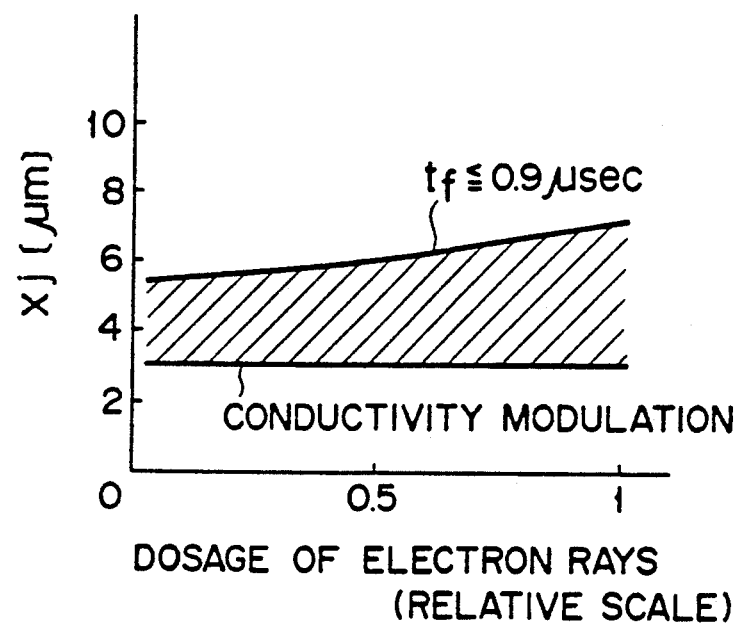
FIG. 5 is a graph showing a relationship between the thickness of a p-type layer and dosage of electron rays, from which a range of the layer thickness providing a preferable element characteristic can be seen.

The element manufactured by the manufacturing method of the above-mentioned embodiment is irradiated by electrons, for element switching speed improvements. A maximum of dosage to satisfy relation $V_{CE}$ <4V is set at 1. The dosage of electrons are varied at 0, 0.5, 1.0, and 11.5. At these points of dosage, the relationship between the element switching speed (fall time) tf and the collector-emitter voltage $V_{CE}$ is shown in FIG. 4. A region where a preferable element characteristic exists in connection with the dosage-xj relation, is illustrated hatched in FIG. 5. The upper border line of the hatched region in FIG. 5 indicates the upper limit to satisfy tf < 0.9 μsec, which is required for the satisfactory element characteristic. The lower border line indicates the lower limit under which no conductivity modulation occurs. From the graph of FIG. 5, it is seen that the upper limit of xj is approximately 7 μm.

Figure 6:
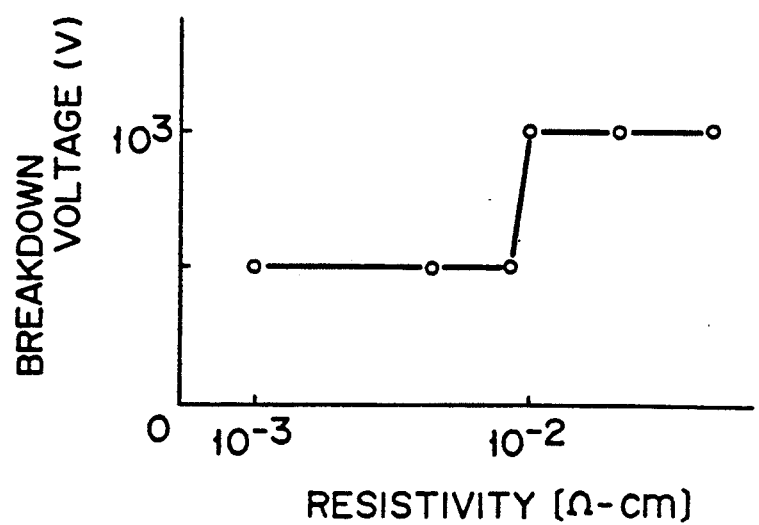
FIG. 6 is a graph showing a relationship between a resistivity of a $p+$-type Si substrate and the breakdown voltage of the element.

FIG. 6 shows the results of measurement of the element breakdown voltage when resistivity of p+ Si substrate 11 is varied. The results show that when resistivity is less than 0.01 Ω·cm, the breakdown voltage is extremely reduced. This is due to the fact that when the resistivity of p+-type Si substrate 11 is excessively low, the thickness of p-type layer 14 must increases, so that n+-type layer 13 for restricting extension of the depletion layer substantially disappears. When the resistivity is larger than 0.05 Ω·cm, it is difficult to obtain a satisfactory thickness of p-type layer 14.

As recalled, in the above-mentioned embodiments, p-type layer 14 is formed by the impurity diffusion from p+-type silicon substrate 11. If necessary, the boron ion implantation for p-type layer 14 formation may be previously applied to n type Si substrate 12.

Figure 7:
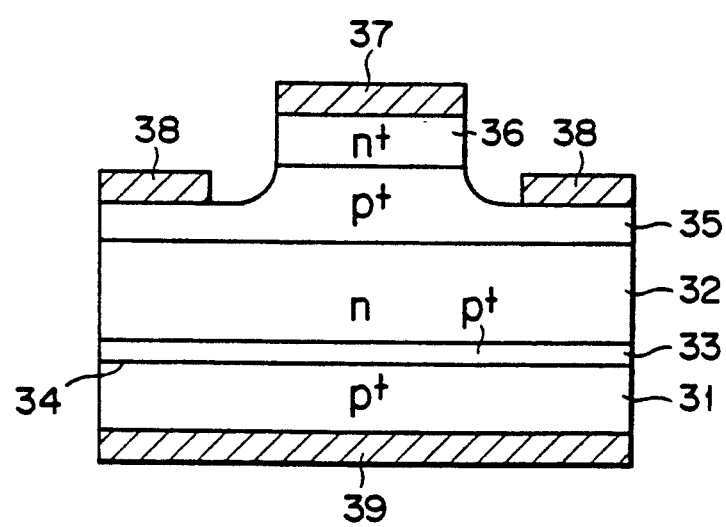
FIG. 7 shows a sectional view showing a GTO manufactured according to another embodiment of a method of manufacturing semiconductor devices according to this invention.

It is evident that this invention is applicable not only to the conductivity type MOSFET in the above mentioned embodiments, but also to other semiconductor elements. An exemplary structure of a GTO which is manufactured by the method according to this invention, will be shown in FIG. 7. The process steps to manufacture will be described in brief. p-type Si substrate 31 and n−-type Si substrate 32 are directly bonded to form a wafer unit, as in the case of the embodiments as mentioned above. If necessary, the wafer unit is subjected to the heat treatment after the bonding step, to diffuse impurity in p+-type substrate 31 into n− type substrate 32 and to form p-type diffusion layer 33. Subsequently, the well known steps are used for forming p-type base region 35, n-type emitter region 36, and cathode electrode 37, gate electrode 38 and anode electrode 39.

Also in this embodiment, if the total impurity amount of p-type diffusion layer 33 on bonding interface 34 is set within the range of the previous case, the effects similar to those as obtained by the abovementioned embodiment, can be obtained.

If necessary, to reduce the carrier life time at the bonding interface, the lifetime killer such as gold is thermally diffused. In this case, the nature of lifetime killer that the diffused lifetime killer tends to concentrate at the interface, can be utilized.

As described above, in forming the element wafer by direct substrate bonding technique, a total amount of impurity in the diffusion layer, which is formed in the surface region of the substrate of low resistivity and is to work as an emitter, is set within a predetermined range by utilizing the fact that the carrier lifetime is low in the bonding interface. With this technical idea, the excellent element characteristics which have not been ever attained can be obtained.

What is claimed is:

1. In a semiconductor device, the improvement comprising a first semiconductor substrate of a first conductivity type and a second semiconductor substrate of a second conductivity type, which is bonded to said first semiconductor substrate, wherein an emitter region of the first conductivity type is formed in the bonding surface of said second substrate and a total amount per unit area of impurity of said emitter region is $1 \times 10^{13}/cm^2$ to $2 \times 10^{15}/cm^2$, the thickness of said emitter region is 7 μm or less, and a number of crystal defects exist on the bonding interface, so that an emitter injection efficiency is lowered.

2. A semiconductor device according to claim 1, in which said first and second semiconductor substrates are doped with lifetime killer.

3. A semiconductor device according to claim 1, in which the thickness of said emitter region is 3 to 6 μm.

4. A semiconductor device according to claim 1, in which the resistivity of said first semiconductor substrate is 0.01 to 0.05 Ω·cm, and the thickness of said emitter is 3 to 7 μm.

5. A semiconductor device according to claim 1, in which said first and second semiconductor substrates have different indices of a plane.

6. A semiconductor device according to claim 1, in which a total amount per unit area of impurity of said emitter is $1 \times 10^{14}/cm^2$ to $1 \times 10^{15}/cm^2$.

7. A conductivity modulation type MOS filed effect transistor, comprising a semiconductor substrate of a first conductivity type and a second semiconductor substrate of a second conductivity type, which is bonded to said first semiconductor substrate, wherein an emitter region of the first conductivity type is formed in the bonding surface of said second substrate and a total amount per unit area of impurity of said emitter region is $1 \times 10^{13}/cn^2$ to $2 \times 10^{15}/cm^2$, the thickness of said emitter region is 7 μm or less, a number of crystal defects exist on the bonding interface, so that an emitter injection efficiency is lowered, source and drain regions are formed in the surface of the second substrate, a gate insulating layer is formed on the surface of the second substrate, and a gate electrode is formed on the gate insulating layer.

* * * * *